United States Patent [19]

Delaney

[11] Patent Number: 5,541,589
[45] Date of Patent: Jul. 30, 1996

[54] POWER METER DATA ACQUISITION AND CONTROL SYSTEM

[76] Inventor: Patrick J. Delaney, 2817 108th Ave. E., Puyallup, Wash. 98372

[21] Appl. No.: 356,842

[22] Filed: Dec. 15, 1994

[51] Int. Cl.⁶ .................................................. G08B 23/00
[52] U.S. Cl. ............................. 340/870.02; 340/870.03; 340/870.05; 340/870.06; 340/870.11; 340/825.03; 340/825.08; 455/53.1; 455/62; 455/71
[58] Field of Search ................ 340/870.02, 870.03, 340/870.05, 870.06, 870.11, 870.18, 870.26, 870.31, 825.03, 825.04, 825.06, 825.07, 825.08, 825.69, 825.72, 825.73, 825.54; 455/50.1, 53.1, 62, 63, 67.3, 71

[56] References Cited

U.S. PATENT DOCUMENTS

| | | | |
|---|---|---|---|
| 4,349,879 | 9/1982 | Peddie et al. | 364/492 |
| 4,549,274 | 10/1985 | Lerner et al. | 364/492 |
| 4,639,728 | 1/1987 | Swanson | 340/870.03 |
| 4,811,011 | 3/1989 | Sollinger | 340/870.02 |
| 4,819,180 | 4/1989 | Hedman et al. | 364/492 |
| 4,847,781 | 7/1989 | Brown, III et al. | 364/492 |
| 4,940,976 | 7/1990 | Gastouniotis et al. | 340/870.02 |
| 5,014,213 | 5/1991 | Edwards et al. | 364/483 |
| 5,056,107 | 10/1991 | Johnson et al. | 375/1 |
| 5,107,440 | 4/1992 | Callahan et al. | 364/492 |
| 5,142,694 | 8/1992 | Jackson et al. | 455/67.1 |
| 5,438,329 | 8/1995 | Gastouniotis et al. | 340/870.02 |

*Primary Examiner*—John K. Peng
*Assistant Examiner*—Andrew Hill
*Attorney, Agent, or Firm*—Joan H. Pauly

[57] ABSTRACT

Each of a plurality of utility clients has a meter at the client location. A reader, such as an infrared emitter and optical photosensor arrangement, obtains consumption information from the meter and provides the information to a microprocessor. The microprocessor stores the information as data in memory. A server located remotely from the client locations sends polling messages to the client locations to obtain the consumption data. Messages are sent one at a time, with a period between messages to await a response. Messages from the server and to the client locations and from the client locations to the servers include error correction fields to enable the receiving location to check the message for errors. The server scans a range of radio frequencies to measure traffic and noise and uses information obtained to create a radio frequency hop map. This map is transmitted to client locations for use in future responses to polling messages.

10 Claims, 5 Drawing Sheets

| SYNC | ADDRESS | OPCODE | DATA | FEC |

| SYNC | ADDRESS | OPCODE | FEC | DATA | CHECKSUM |

| PREAMBLE | ADDRESS | OPCODE | TIME STAMP | DATA | CHECKSUM |

| PREAMBLE | ADDRESS | TIME STAMP | DATA | CHECKSUM |

POWER METER DATA ACQUISITION AND CONTROL SYSTEM

TECHNICAL FIELD

This invention relates to systems for remotely gathering consumption data from a plurality of utility client locations and, more particularly, to such a system in which communications between a server and client locations are automatically validated by both the server and the client locations and in which the server selects radio frequencies for the communications, based on scanning of radio frequencies to measure traffic and noise, to minimize interference with the communications.

BACKGROUND INFORMATION

In modern American society, the typical household is served by a plurality of utilities. Such utilities include those that provide electrical power, water, and natural gas to the household. The customers are billed based on their rate of consumption of the supplied power, water, or gas. The current standard method for measuring consumption has been in use for decades and is based on the provision of a consumption meter on the premises of each customer.

Billing of customers is determined by readings of the individual meters on a periodic, such as monthly, basis. The reading of the meters is a time consuming and labor intensive, and thus expensive, undertaking. A meter reader must go to each customer location each billing cycle. In most cases, reading the meter requires the reader to enter the premises of the customer. This is an intrusion on the customer's property rights and can also involve hazards to the reader. Such hazards include unfriendly dogs, physical conditions that can cause injury, and the risk of being mistaken for a burglar. In addition, some customers fail to maintain the premises properly and allow vegetation or debris to obscure the meter location. This further adds to the difficulty and time consuming nature of the meter reading task.

Recently, recognition of the inefficiency of the customary meter reading procedure has increased, and there have been proposals for remotely gathering the consumption data from client locations. One type of proposal involves short range transmission of a reading from the meter. These transmissions are picked up by a meter reader who drives from customer location to customer location and stops in front of each location to receive the transmission and obtain a meter reading. This arrangement eliminates the problems associated with the meter reader actually entering onto the property of the customer, but provides only a small reduction in the cost and labor required for the meter reading procedure.

Other proposals are based on gathering data by means of communications between the various customer locations and a central location remote from the customer locations. Swanson, U.S. Pat. No. 4,639,728, granted Jan. 27, 1987, discloses such a system in which the customer meters are polled by the use of telephone lines. A central computer polls each meter by telephoning the meter and obtaining consumption data. This kind of system eliminates the need for meter reading personnel to visit each customer location, but has a number of drawbacks. Putting the system into operation would be cumbersome since it would require interfacing the telephone service with the utility meter. In addition, the system requires either a dedicated line at each client location or time periods during which the customer's telephone line is not available for the customer's use.

The use of radio communications potentially eliminates the need for interfacing the data gathering system with a wired system, such as a telephone or cable system. Johnson et al., U.S. Pat. No. 5,056,107, granted Oct. 8, 1991, discloses a radio communication network for remote data generating stations, such as utility meters. This patent discusses in some detail a major problem involved with the use of radio communications for remote data gathering. This problem is collisions between various transmissions that result in the loss of individual transmissions. Johnson et al. describes the use of different frequencies to overcome this problem as being impractical. Instead, the system disclosed in the patent relies on the use of a plurality of receiving stations that receive the transmissions from the remote stations. There is overlap between the receiving stations and resulting duplication of transmission that is described as reducing the number of data packets lost by virtue of collisions or interference of transmissions.

SUMMARY OF THE INVENTION

The present invention is directed toward a system of remotely gathering consumption data from a plurality of utility client locations in which the client locations are polled one at a time by a server in order to avoid communication collisions.

According to an aspect of the invention, a method of remotely gathering consumption data from a plurality of utility client locations comprises providing a server remote from the client locations, and providing each client location with a unique client identification. At each client location, consumption data is automatically generated and stored. A radio frequency polling message is sequentially transmitted from the server to each of the client locations. The message has a client identification field and an error correction field. The sequential transmitting includes, after sending each message, automatically checking for a response before sending a subsequent polling message. At each client location, steps for receiving and processing the message are automatically carried out. When a message is received, the error correction field is used to automatically check for errors in the message. The received message is checked for the client location's client identification. For each message that includes the client location's client location, a response is automatically prepared in a format having a data field and a client error correction field. The preparation of the response includes retrieving the consumption data and inserting it into the data field. The prepared response is sent to the server by a radio frequency transmission. At the server, the response is received, the client error correction field is used to automatically check for errors in the response, and the data from the data field is stored.

A preferred feature of the above method is automatically performing, at the server, steps for determining a hop map and communicating the hop map to the client locations. A range of radio frequencies is scanned to measure traffic and noise, and information obtained from the scanning is used to create a radio frequency hop map. The hop map and a switch-over time are transmitted to the client locations. At each client location, the hop map is stored and, after the switch-over time, responses to polling messages are transmitted on frequencies designated by the hop map. This preferred feature allows the method to be carried out in a way that minimizes collisions and interference with the communications between the server and the client locations.

The method may comprise providing a plurality of servers each of which transmits polling messages to a different plurality of client locations. At each server, the steps for creating and transmitting a hop map are carried out. Differences between the hop maps created by the different servers prevent communications of one server from interfering with communications of another server.

According to another aspect of the invention, a system for remotely gathering consumption data from a plurality of utility client locations comprises, at each client location, a consumption reader, a memory operatively connected to the reader to receive data therefrom, an information processor, and a radio frequency receiver and transmitter. The system further comprises a server remote from the client locations and having an information processor and a radio frequency receiver and transmitter. The information processor of the server is programmed to periodically generate a polling message addressed to each client location, with each message having an error correction field. The processor is also programmed to operate the server's receiver and transmitter to sequentially transmit the messages to the client locations, to check for a response after sending each message before sending a subsequent message, and to check each response received for errors. Each information processor at a client location is programmed to check messages received by the location's receiver and transmitter for errors, to validate messages, and to prepare and send responses. Messages received from the server and addressed to the location are validated. Data is retrieved from the memory and used to prepare responses to validated messages. The processor operates the location's receiver and transmitter to send the responses to the server. The system may also have the preferred features of the capability of generating hop maps and the use of a plurality of servers described above.

According to another aspect of the invention, a method of remotely gathering consumption data from a plurality of utility client locations comprises providing a server remote from the client locations, providing each client location with a unique client identification, and, at each client location, automatically generating and storing consumption data. Periodically, a radio frequency polling message having a client identification field is sequentially transmitted to each client location from the server. The transmitting includes, after sending each message, automatically checking for a response before sending a subsequent message. Messages received by each client location are automatically processed. Each message is checked for the client location's client identification. For each message that includes the client identification, consumption data is retrieved and inserted into a data field of a response format, and the response is sent to the server by a radio frequency transmission. At the server, the response is received and data from the data field is stored. In addition, at the server, a range of radio frequencies is scanned to measure traffic and noise, and information obtained from the scanning is used to create a radio frequency hop map. This hop map is transmitted along with a switch-over time to the client locations. The hop map is stored at each client location. After the switch-over time, responses to polling messages are transmitted on frequencies designated by the hop map. As noted above, the feature of using a hop map created by the server for communications helps minimize interference between communications and allows the use of a plurality of servers each of which serves a different plurality of client locations.

According to still another aspect of the invention, a system for remotely gathering consumption data from a plurality of utility client locations comprises, at each client location, a consumption reader, a memory, an information processor, and a radio frequency receiver and transmitter, as described above. The system also has a server remote from the client locations and having an information processor and a radio frequency receiver and transmitter. The information processors are programmed to carry out the steps described in the preceding paragraph.

The system of the invention provides a highly accurate and cost effective means for remotely gathering consumption data from utility customers. Since the system uses radio communications between geographically scattered customer locations and a server, the disadvantages associated with the need in conventional systems for sending a meter reader to each location are eliminated. Moreover, the system avoids the problem of collisions between transmissions that may occur in radio communication systems, recognized by Johnson et al. in U.S. Pat. No. 5,056,107, cited above. The present system avoids this problem in a highly cost effective manner since the solution provided by the present system does not require redundant servers or redundant communications. Thus, the disadvantages of increased cost and complexity engendered by redundant servers is avoided by the present invention. Rather than relying on redundancy to increase the reliability of the system, like the Johnson et al. system, the system of the present invention attains maximized reliability by sequential communications between the server and individual client locations. The reliability is enhanced by the preferred feature of error checking by both the server and each client location and/or the preferred feature of generating hop maps to take advantage of frequency ranges with low traffic and noise.

BRIEF DESCRIPTION OF THE DRAWINGS

In the drawings, like element designations refer to like parts throughout, and.

BEST MODE FOR CARRYING OUT THE INVENTION

The drawings illustrate a data gathering system that is constructed according to the invention and that constitutes the best mode of the method and apparatus aspects of the invention currently known to the applicant. In its basic form, the invention comprises a plurality of client locations and a server that communicates with these locations. In accordance with the invention, the complete system may comprise just these components or may further comprise additional servers communicating with additional client locations and/or a master controller that communicates with the server or servers. Provision of levels of communication in addition to these three levels of client locations, servers, and master controller could be provided, but generally would not be desired.

Figure 1:
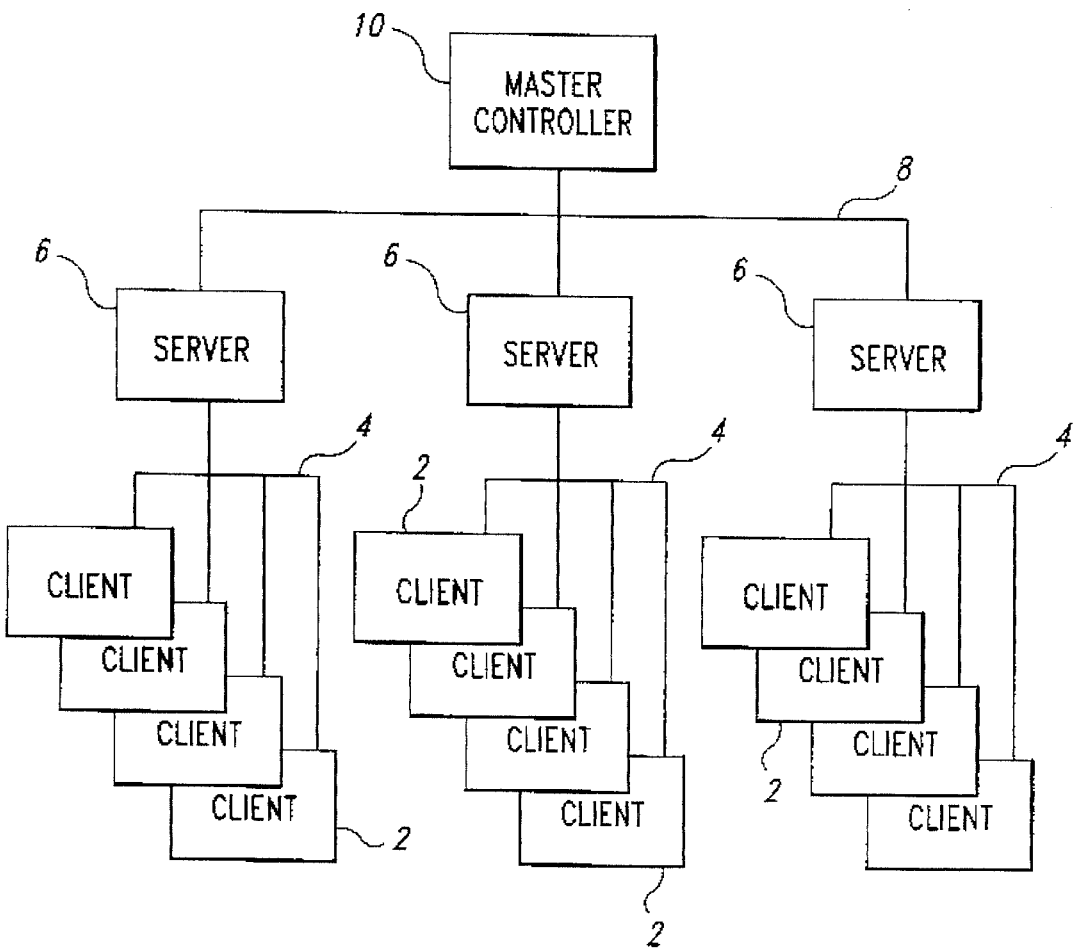
FIG. 1 is a schematic diagram illustrating the overall architecture of the preferred embodiment of the power meter data acquisition and control system of the invention.

FIG. 1 shows the overall architecture of the preferred embodiment of the system. The system includes a plurality of groups of client locations 2. Although three groups of client locations 2 with four clients in each group are shown in FIG. 1, it is intended to be understood that any number of groups of client locations 2 may be included and that the number of individual client locations 2 in each group may vary considerably. In general, it is desirable to maximize the number of client locations 2 in each group to help maximize the simplicity of the structure of the system. The major factors limiting the number of client locations in each group are the geographical limitations on communications with the client locations and time limitations for asynchronous, or sequential, communications between the client locations and a single remote server. A server 6 is provided for each group of client locations 2. The server 6 communicates with its client locations 2 by means of a communications link 4. In turn, each server 6 communicates with a master controller 10 over a communications link 8.

It is contemplated that in most situations, each client location 2 will be the premises of a customer of a utility, such as an electric utility. The servers 6 will be located in customer regions with boundaries designed to maximize the efficiency of communications between the client locations 2 and the servers 6. The master controller will be a main frame computer at a central location. It is anticipated that the communication links 4, 8 will be radio frequency communication links with the link 8 between the servers 6 and master controller 10 desirably including a satellite relay. Server-client communications links may also include a satellite relay. The radio frequency communications may be narrow-band, broad-band, or spread spectrum.

At each client location 2, a client data gathering and electronics package is provided in association with the conventional utility meter. Preferably, the entire package is located within the meter housing. The meter itself includes a conventional consumption detector such as a hysteresis wheel. The system's client package includes a consumption reader for obtaining consumption data from the meter. For example, the consumption reader may comprise an infrared emitter positioned on the wheel and an optical photosensor positioned adjacent to the wheel that detects each rotation of the wheel by detecting the infrared signal from the emitter. The rotation count from the reader is stored in a memory operatively connected to the reader to receive data therefrom. The operative connection between the reader and memory may take various forms and does not require actual physical connection between the reader and the memory. Preferably, the count from the reader is communicated to an information processor that converts the count into consumption data and stores the data in memory. In addition to the reader and information processor and associated memory, the client package includes a radio frequency receiver and transmitter.

Figure 2:
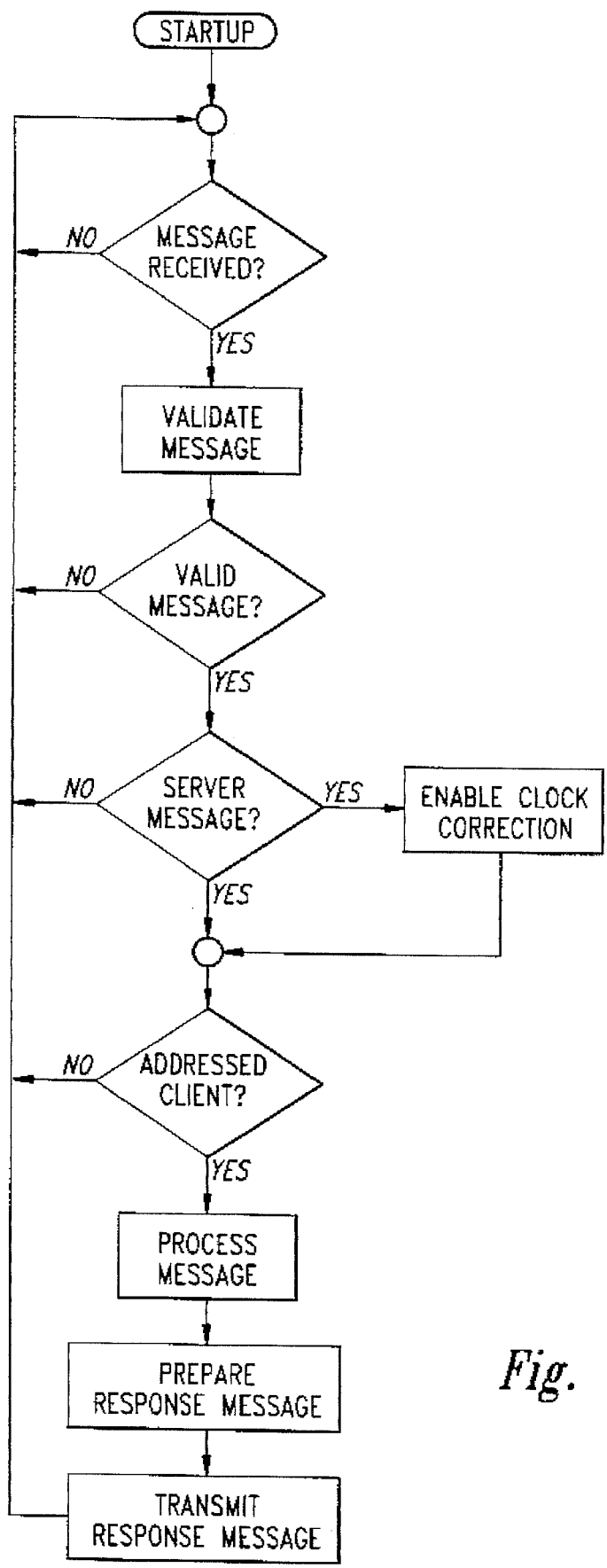
FIG. 2 is a logic diagram illustrating the programmed logic of the portion of the system located at each client location.

FIG. 2 is a logic diagram illustrating the functioning of the client package. The startup block at the top of FIG. 2 illustrates an initialization routine carried out when a customer is brought on line, when the system is put into operation, or when reinitialization is required after a lengthy power outage. Startup includes providing the client location 2 with a unique client identification to enable the logic at the location to identify messages addressed to it. Initialization also provides the client location with a frequency or frequency spread on which client responses are to be transmitted until the server instructs the client to change the response frequency or frequencies. The initial or changed frequency or frequencies are stored in the memory associated with the client information processor.

Once the client location electronics have been initialized, the client logic continuously loops checking for messages received. The programming of the information processor to look for, check, and process messages may be provided by software, hardware, or a combination of software and hardware. At the beginning of the loop, the logic checks to see if a message has been received. If no message has been received, the logic returns to the beginning and again checks for a message. If a message has been received, the logic validates the message, or in other words, checks the message for the appropriate format. On the basis of the format analysis, the logic either determines that a valid message has been received and proceeds to the next step of checking to see that a server message has been received, or determines that the message is not valid and returns to the beginning of the loop to look for a message received. For a valid message that is not a server message, the logic again returns to the beginning of the loop. For a valid message that is a server message, the logic initiates a procedure to synchronize the timing between the client location 2 and the server 6 to compensate for drift in the client timer. In addition, the server message is checked to see that it is addressed to the particular client location 2, i.e. to see if the correct unique client identification is included in the message. If not, the loop again returns to the beginning.

If the correct client identification is present, the logic processes the message, prepares a response message, and transmits the response message to the server. Then, the logic once again returns to the beginning of the loop to check for messages received. In the case of a polling message from the server, the processing of the message and preparation of a response message include checking the message for errors, retrieving consumption data from the memory and using the retrieved data to prepare the response, and operating the location's receiver and transmitter to send the response.

Figure 3:
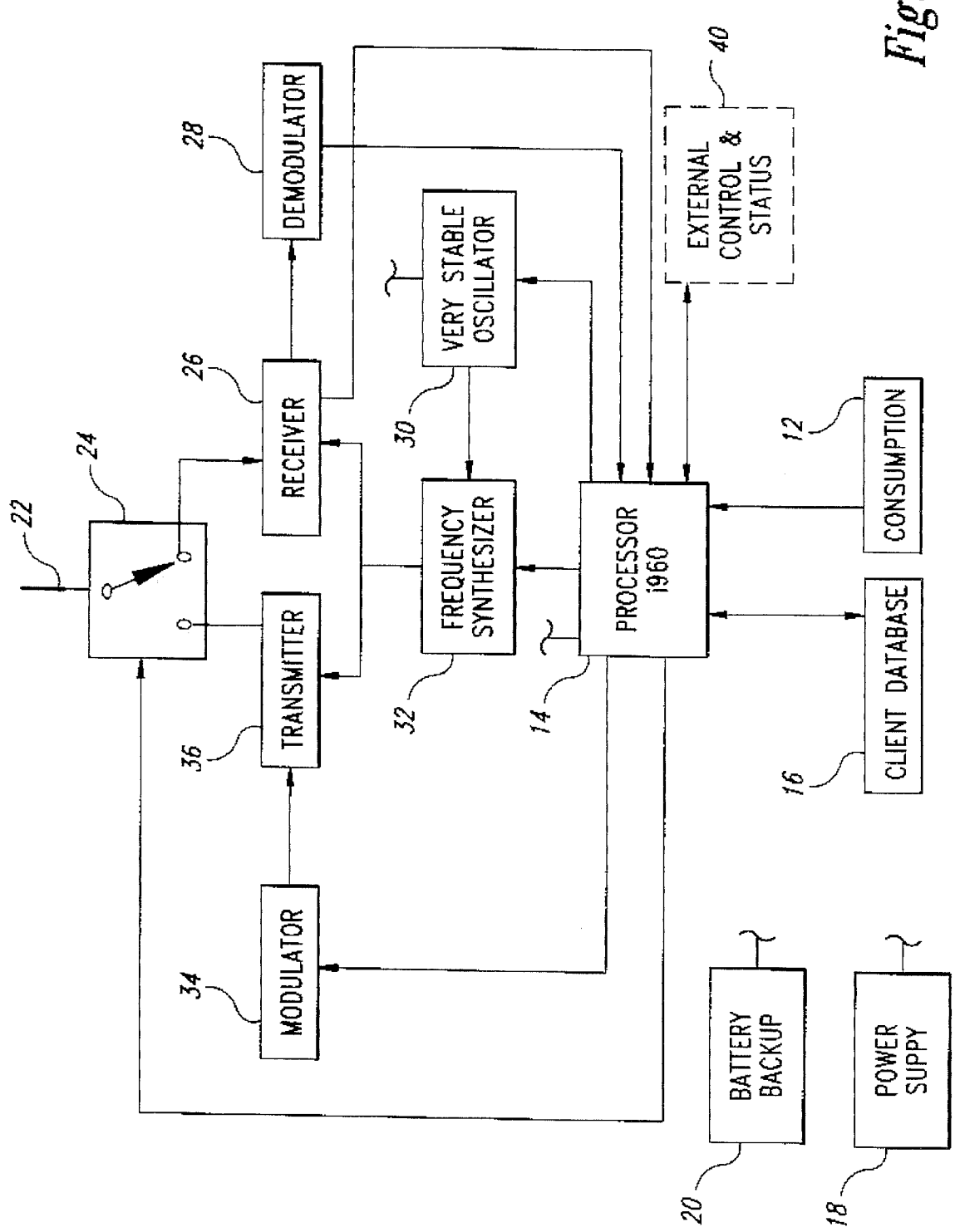
FIG. 3 is a schematic diagram showing the hardware elements of the client location component of the system and illustrating the functioning of the elements.

FIG. 3 illustrates the hardware of the preferred embodiment of the client package. In FIG. 3, the utility meter and associated reader are represented by the consumption box 12. As described above, the reader communicates consumption information to the information processor 14 which converts the information into consumption data and stores it in a memory 16 associated with the processor 14. The processor 14 and other electronic components of the package are powered by a power supply 18 which, in the case of a system for measuring power consumption by electric utility customers, preferably receives its power from the supply side of the power meter. A battery backup 20 is preferably provided to maintain the memory in the event of a power outage. The currently preferred embodiment of the information processor is an Intel Corporation 1960 (Trademark) microprocessor with associated RAM and ROM memory.

Still referring to FIG. 3, the client package includes a dipole antenna 22 for receiving and transmitting messages. An antenna switch 24 is associated with the antenna and has a normal receiving position, illustrated in FIG. 3, and a transmitting position. The switch 24 is always in the receiving position unless a message is being transmitted from the client location. Messages received by the antenna 22 are detected by a receiver 26 and sent to the information processor 14. The receiver 26 mixes the incoming radio frequency signal with a local oscillator signal that tracks the server's transmitted signal. The local oscillator signal is generated by a frequency synthesizer 32 that converts the output of a very stable oscillator 30 into a signal that tracks the server's signal.

The server signal is preferably transmitted using spread spectrum modulation. The information processor 14 has a hop map stored in its memory that includes the designated hop frequencies of the server communications. The processor 14 uses this map and the signal it receives from the receiver 26 to calculate a difference signal representing the error in the signal from the receiver 26. Based on this calculated difference signal, the processor 14 communicates a hop control signal to the frequency synthesizer 32 to cause the synthesizer 32 to more accurately track the incoming server signal. The processor also communicates with the oscillator 30 to control drift of the oscillator and automatically maintain the oscillator frequency. This is accomplished by the processor 14 compensating for short term drift and computing long term compensation factors. These factors are determined by the processor 14 computing third order drift characteristics from the measured frequency error between the received server signal and the hop frequency. These calculations are performed for each message received from the server and are coordinated with internal environmental measurements at the client location, such as temperature measurements.

In addition to controlling the detection and mixing of the incoming signal, the processor 14 processes the message carried by the received signal. The receiver 26 transmits the incoming signal mixed with the local oscillator signal to a demodulator 28, which demodulates the mixed signal and transmits it to the processor 14. In the processor 14, the message contained in the demodulated signal is validated, checked for errors, and checked to determine that it is a server message and is addressed to the particular client location. For each validated message from a server addressed to the location, the processor 14 retrieves the requested data from the memory 16 and uses the retrieved data to prepare a response to the message. Then, the processor 14 causes the response message to be transmitted to the server. The response message is transmitted in binary form from the processor 14 to a modulator 34. The modulator 34 transforms the message into a frequency shifting signal which it sends to a transmitter 36. When the message is ready to be transmitted, the switch 24 moves to its transmit position and the response message is transmitted to the server via the antenna 22. As shown and described herein, a single antenna 22 is used for both receiving and transmitting messages. Two different antennas could be provided for these two functions without departing from the spirit and scope of the invention. The use of a single antenna is generally desired since it helps to maintain the capability of including the entire client package within the meter housing.

An additional element of the client package is shown in FIG. 3 in broken lines. This element is an external control and status module 40. Such a module represents the inclusion in the system of the invention of the additional feature of power demand control. In a system with this feature, the power consumption of individual clients may automatically be reduced at peak consumption times in order to avoid excessive power demand and possible brown outs or black outs. In a typical power distribution system, energy consumption varies cyclically over a period of time with peak and minimum demand levels. Normally, the demand levels of all or almost all customers follow the same cycle of peaks and valleys. In such a situation, the system of the invention may be used to detect actual consumption rates at anticipated peak periods. If total consumption exceeds or is anticipated to exceed a predetermined level, the server may signal all or selected client locations to implement demand reductions. Such reductions may be accomplished, for example, by automatically shutting down air conditioners or other designated appliances for a specified period of time. Various structures of systems for demand control have been proposed. The basic structure of the system of the present invention relates to consumption data gathering and does not require demand control. Therefore, the optional feature of the additional function of demand control will not be described further herein.

Figure 4:
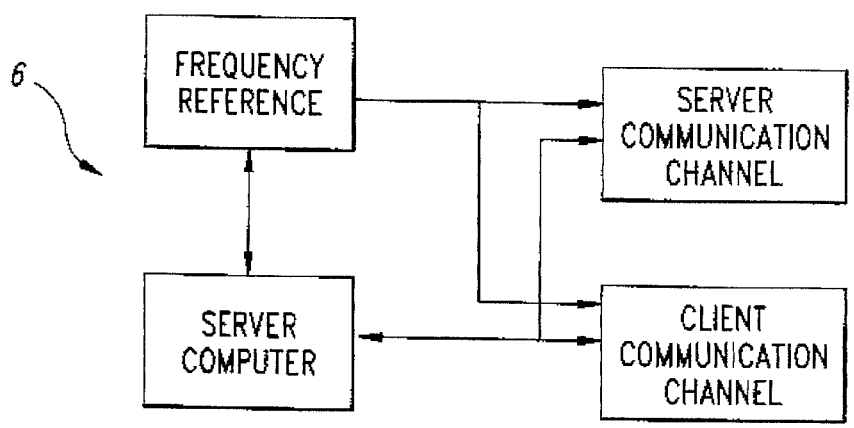
FIG. 4 is a block diagram illustrating the overall functioning of the server component of the system.

FIG. 4 is a simplified diagram of the structure of a server 6. The server 6 includes a server computer and a frequency reference. The frequency reference is a memory module in which the frequency hop maps for communications between the server and client locations and communications between the server and the master controller are stored. The server communication channel provides communication between the server and the master controller. The client communication channel provides communication between the server and the client locations. Preferably, the client communication channel incorporates substantially the same elements as are shown in FIG. 3 and described in connection with the client package. The major differences would be the absence, in the server hardware, of the meter and reading consumption element 12 and, if relevant, the external control and status module 40.

Figure 5:
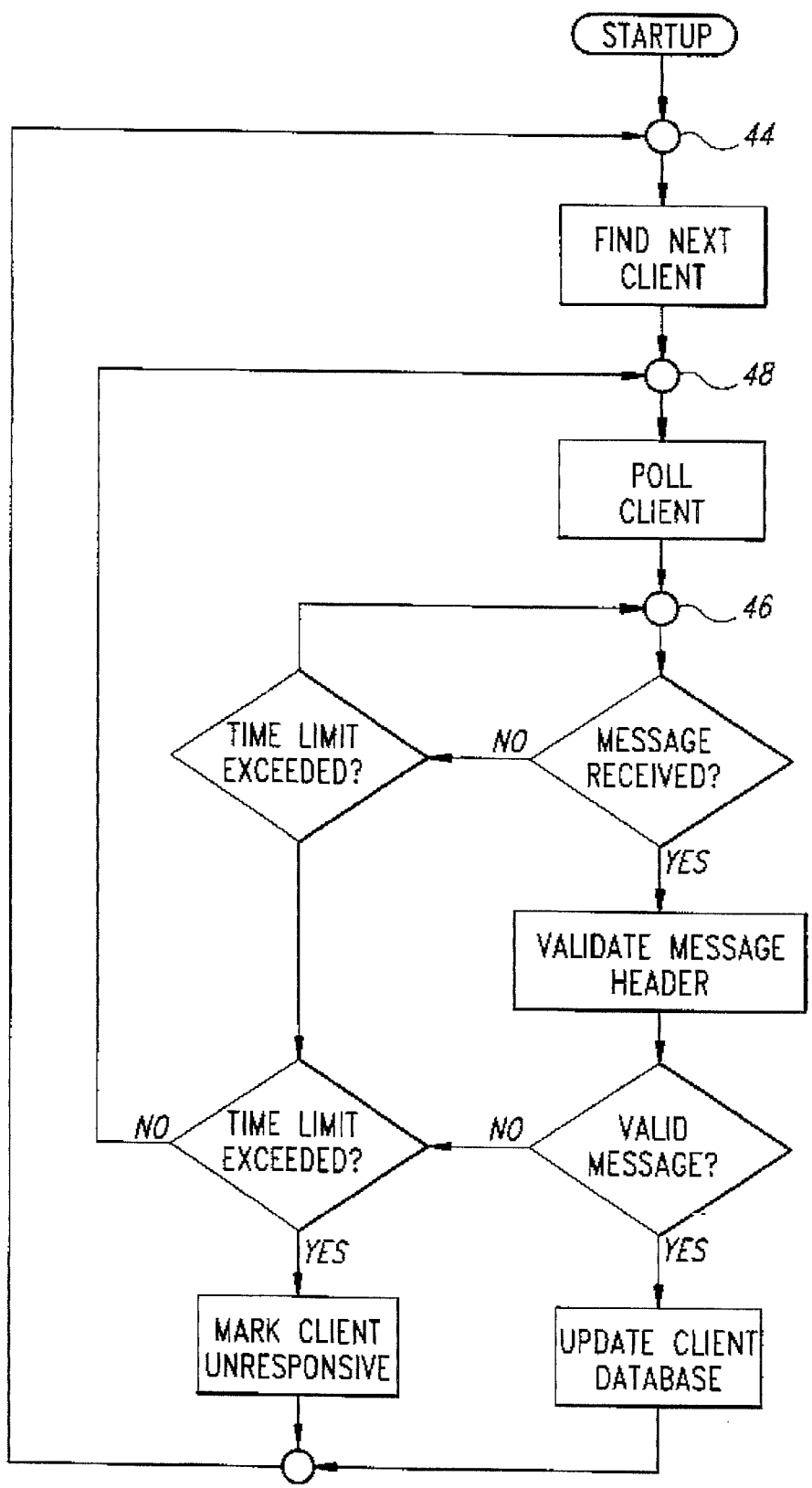
FIG. 5 is a logic diagram illustrating the programmed logic of the server component of the system.

FIG. 5 illustrates the logic flow for the server communications with the client locations. As in the case of the client logic illustrated in FIG. 2, the server logic illustrated in FIG. 5 may be implemented by means of software, hardware, or a combination of software and hardware. The server includes an information processor and a radio frequency receiver and transmitter by means of which it carries out its programmed logic. At startup, the server is provided with frequency hop maps that designate frequencies for communications with client locations and the master controller. The hop map or maps for client location communications may be different from the hop map for communications with the master controller, or the same hop maps may be used for all communications. In the latter case, communications between the master controller and the servers preferably occur at times when there are no communications occurring between the servers and the client locations. This arrangement ensures that all communications within the system are asynchronous so that message collisions are avoided. At startup, the server is also provided with a client database that includes client identifications and any other information that may be required for server processing of communications to and from client locations.

Once the server 6 has been put into operation, it periodically sends polling messages to client locations 2 to obtain consumption data. The polling logic loop has a starting point 44 to which it returns after the polling procedure for a given client has been completed. The first step in the logic loop is to find the next client. This involves obtaining from the client database the appropriate client identification and the instructions to be sent to the client location. This information is used to prepare a polling message which is sent to the client by means of the radio frequency receiver and transmitter to poll the client. Once the polling message has been sent, the server logic checks for a response message received back from the client location. The server logic continuously checks for a response message and for the time elapsed since the polling message was sent. As long as a preset time limit has not been exceeded, the subloop of checking for a response continues to return to the beginning point 46 of the subloop. Once the time limit has been exceeded, the logic checks to see if the retry limit has been exceeded. The retry limit is a predetermined number of times that the polling message will be sent to a particular client location before a client will be marked unresponsive and the logic loop returns to its beginning 44. The logic continues to resend the message by returning to the initial point 48 of the message sending procedure until the retry limit has been exceeded.

If a response message is received, the server logic validates the message in much the same manner that the client logic validates messages from the server. If a message is determined to be not valid, the logic checks to see if the retry limit has been exceeded. If not, it returns to the beginning 48 of the message loop and again sends out the polling message. If so, the client is marked unresponsive and the loop returns to the beginning 44. If the message is determined to be valid, the client database maintained by the server is updated with the information included in the message from the client location and the loop returns to the beginning 44 to find the next client to which a polling message is to be sent.

Figures 6, 7, 8, 9, 10:
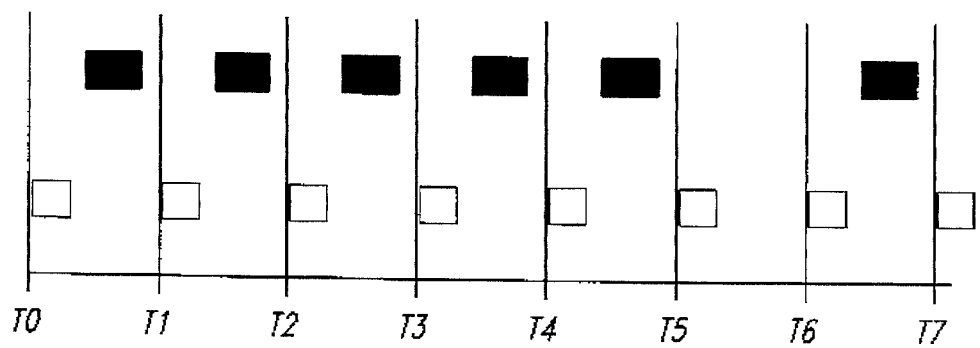
FIG. 6 is a schematic diagram illustrating the format of server messages to client locations.
FIG. 7 is like FIG. 6 except that it illustrates the format of messages from the client locations to a server.
FIG. 8 is a schematic diagram illustrating the time intervals between server polling messages to client locations.
FIG. 9 is a schematic diagram illustrating the format of a message from the master controller to a server.
FIG. 10 is like FIG. 9 except that it illustrates the format of the response message from the server to the master controller.

FIG. 6 illustrates the format of server messages to clients. The format has five fields including a Sync field that is a unique bit configuration that identifies the beginning of the message and is configured to generate a low bandwidth radio signal to maximize radio signal detection by the client location for oscillator tracking. The Address field includes the unique client identification for the client location to which the polling message is being sent. The Opcode field specifies the action that the server requests the client location to take. The Data field is information that the client location will need to perform the requested action. Finally, the server message format includes an error correction field in the form of an FEC (Forward Error Correction) field Reed-Solomon code that is used by the client location to correct for errors in the message from the server. It is anticipated that three or fewer errors may be corrected in a message by use of the FEC field.

The Data field may include, for example, a new hop map configuration for response messages from the client location to the server along with a switch-over time at which the client is to switch to the new hop map configuration. When a client location receives a message including such data, the information processor 14 stores the hop map in its memory and transmits any responses to polling messages after the switch-over time on the frequencies designated by the stored hop map configuration. Normally, a message from the server instructing the client location to change a hop map configuration would not request any further action. Polling messages requesting the sending of consumption data from the client location to the server would normally be separate from messages instructing a change in the hop map configuration. Polling messages would ordinarily have an empty Data field.

FIG. 7 illustrates the message format for messages from a client location to the server. The Sync field is a unique bit configuration similar to the Sync field in the server message except that it identifies the message as a client message. The Address field identifies the client responding to the server's request. The Opcode field is a bit configuration that provides refinement of the response message information, including the size of the Data field. The FEC field is a Reed-Solomon Forward Error Correction (FEC) code that provides for correction of up to three errors across the Address and Opcode fields. The Data field includes the data requested by the server from the client location. The Checksum field is also an error correction field and provides bit sum checking of the message to guarantee the preciseness of the message Data field.

FIG. 8 illustrates the timing of polling messages from the server to client locations. The white boxes in the lower row represent polling messages sent by the server. The black boxes in the upper row represent response messages sent by the client locations in response to polling messages received from the server. The polling procedure begins at time T0, and the messages are spaced by a predetermined time interval. In FIG. 8, T1 represents one time interval after the beginning of the polling procedure, T2 represents two time intervals after the beginning, and so on. In the first five time intervals shown in FIG. 8, a client response message is received by the server within the given time interval. In the sixth time interval, no response is received by the server, and so a second polling message is sent to the same client location at the beginning of the seventh time interval. In this case, a client response is received. If no response were received in the seventh interval, and the server logic had a one retry limit, the server would mark the client location as unresponsive and send a polling message to another client location in the eighth time interval.

FIG. 9 illustrates the format of a message from the master controller to a server. The master controller message has six fields, including a Preamble field that identifies the beginning of the message and provides compatibility with existing communicate on protocols. The Address field identifies the server and the client location to which the message is directed. The identification of the client location might be a single client location, a specific group of client locations, or all of the client locations under the control of the server. For example, the master controller might direct the server to poll all of the client locations for current consumption data. The next field is an Opcode field that specifies the action that the master controller requests the server to take, such as polling all client locations for current consumption data. The Time Stamp field identifies the time at which the master controller message is sent. The Data field is information that may be required for the server to carry out the action requested in the Opcode field. For example, a new hop map in the Data field would enable the server to carry out an instruction that the server relay a new hop map configuration to one or more of the client locations under its control. Finally, the Checksum field is an error correction field to be used by the server to authenticate the validity of the message.

FIG. 10 illustrates the format of a message from the server to the master controller. The format includes five fields, including a Preamble field that identifies the beginning of the message and provides communication protocol compatibility. The Address field identifies the server and, when the message includes data from a client location or locations, the client locations from which the data has been obtained. The Time Stamp field identifies the time at which the server message is transmitted. The Data field includes any information requested from the server by the master controller. As in the message from the master controller, the Checksum field is an error correction field to enable the master controller to validate the message.

In the system of the invention, all messages are asynchronous to minimize collisions or interference with messages and avoid loss of messages due to interference. The asynchronous requirement for the message traffic means that messages are sent sequentially, rather than simultaneously, and there is a delay after sending a message to await a response before sending a second message. This procedure is described in some detail above with regard to the polling messages from a server to its client locations. The same procedure is preferably followed when the master controller is communicating with a plurality of servers, for example to obtain current consumption data for all the utility customers. The master controller controls all of the communications with the servers. No server messages are sent to the master controller except in response to a message from the master controller. Each server controls the message traffic between itself and its client locations. No client location messages are sent unless they are in response to a message from the respective server. This procedure of controlling communications ensures the asynchronous nature of the overall communications in the system to prevent message collisions. It also results in automatic validation of messages by receipt of appropriate response messages.

The security of the messages against unintended loss of a message is further enhanced by automatically scanning a range of radio frequencies to measure traffic and noise, and creating radio frequency hop maps using the information obtained from scanning to eliminate noisy channels from the spread spectrum frequencies. In most cases, the scanning and creation of the hop map for server/client communications will be performed by the server, which communicates the hop map to its client locations. However, determination of new hop maps may also be accomplished by the master controller, which then relays the hop maps to the servers with instructions to the servers to retransmit the hop maps to the client locations. When each of a plurality of servers determines a hop map for its client communications, differences between the hop maps created by different servers prevent communications of one server from interfering with communications of another server. The hop map or maps for master controller/server communications will normally be determined by the master controller.

The reliability of the system is also enhanced by error checking of each message by the recipient of the message. This is accomplished by the inclusion in all messages of an error correction field or fields. Such fields are illustrated in the message formats shown in FIGS. 6, 7, 9, and 10.

In the preceeding discussion and in the drawings, communications between a server and its client locations are described and illustrated as being accomplished by direct messages between the server and client location. This is generally the preferable arrangement. However, in situations in which client locations are geographically located such that it is impractical for a particular location to communicate directly with the server, the server may communicate with the location via another client location or locations. In such case, the server message to an initial client location would include instructions to relay the message to the target client location or an intermediate client location.

Although the preferred embodiment of the invention has been illustrated and described herein, it is intended to be understood by those skilled in the art that various modifications and omissions in form and detail may be made without departing from the spirit and scope of the invention as defined by the following claims.

What is claimed is:

1. A method of remotely gathering consumption data from a plurality of utility client locations, comprising:

providing a server remote from said client locations, and providing each client location with a client identification;

at each client location, automatically generating and storing consumption data;

transmitting from said server to each said client location a radio frequency polling message having a client identification field;

at each said client location, automatically carrying out the steps of receiving polling messages from said server, checking each said message received for said client location's client identification, and, for each said message that includes said client location's client identification, preparing a response that includes said consumption data and sending said response to the server by a radio frequently transmission; and at the server, receiving said response from said client location;

at the server, automatically performing the steps of scanning a range of radio frequencies to measure traffic and noise, creating a radio frequency hop map using information obtained from said scanning, and transmitting said hop map to said client locations; and at each said client location, storing said hop map and subsequently transmitting responses to polling messages on frequencies designated by said hop map.

2. The method of claim 1, comprising providing a plurality of said servers each of which transmits polling messages to a different plurality of client locations; at each said server, performing said steps of scanning, creating a hop map, and transmitting said hop map; at each said client location, transmitting responses on frequencies designated by the hop map received from said location's respective server; and allowing differences between the hop maps created by different servers to prevent communications of one server from interfering with communications of another server.

3. A system for remotely gathering consumption data from a plurality of utility client locations, comprising:

at each said client location, a consumption reader, a memory operatively connected to said reader to receive data therefrom, an information processor, and a radio frequency receiver and transmitter; and a server remote from said client locations and having an information processor and a radio frequency receiver and transmitter;

said information processor of said server being programmed to periodically generate a polling message addressed to each said client location, and to operate said server's receiver and transmitter to transmit said messages to said client locations;

each said information processor at a client location being programmed to validate messages received from said server and addressed to said location to retrieve data from said memory and use the retrieved data to prepare responses to validated messages, and to operate said location's receiver and transmitter to send said responses to said server;

said information processor of said server being programmed to operate said server's receiver and transmitter to scan a range of radio frequencies to measure traffic and noise, to create a radio frequency hop map using information obtained from scanning, and to operate said server's receiver and transmitter to transmit said hop map to said client locations; and each said information processor at a client location being programmed to store said hop map and use it to determine frequencies of subsequent transmissions from said client location.

4. The system of claim 3, comprising a plurality of said servers each of which transmits polling messages to a different plurality of client locations, each said server having an information processor programmed to create and cause transmission of said hop maps.

5. A method of remotely gathering consumption data from a plurality of utility client locations, comprising:

provisioning a server remote from said client locations, and providing each client location with a unique client identification;

at each client location, automatically generating and storing consumption data;

periodically, sequentially transmitting from said server to each said client location a radio frequency polling message having a client identification field, including, after sending each said message, automatically checking for a response before sending a subsequent one of said messages;

at each said client location, automatically carrying out the steps of receiving polling messages from said server, checking each said message received for said client location's client identification, and, for each said message that includes said client location's client identification, preparing a response in a format having a data field, including retrieving said consumption data and inserting it into said data field, and sending said response to the server by a radio frequency transmission;

at the server, receiving said response from said client location, and storing data from the data field;

at the server, scanning a range of radio frequencies to measure traffic and noise, creating a radio frequency hop map using information obtained from said scanning, and transmitting said hop map and a switch-over time to said client locations; and at each said client location, storing said hop map and, after said switch-over time, transmitting responses to polling messages on frequencies designated by said hop map.

6. The method of claim 5, comprising providing a plurality of said servers each of which transmits polling messages to a different plurality of client locations; at each said server, performing the steps of scanning, creating a hop map, and transmitting said hop map; at each said client location, transmitting responses on frequencies designated by the hop map received from said location's respective server; and allowing differences between the hop maps created by different servers to prevent communications of one server from interfering with communications of another server.

7. The method of claim 5, comprising including, in each said polling message, an error correction field; at each said client location, using said error correction field to check for errors in a received message and including in each said response a client error correction field; and, at the server, automatically using the client error correction field to check for errors in said response.

8. A system for remotely gathering consumption data from a plurality of utility client locations, comprising:

at each said client location, a consumption reader, a memory operatively connected to said reader to receive data therefrom, an information processor, and a radio frequency receiver and transmitter; and a server remote from said client locations and having an information processor and a radio frequency receiver and transmitter;

said information processor of said server being programmed to periodically generate a polling message addressed to each said client location, to operate said server's receiver and transmitter to sequentially transmit said messages to said client locations, and to check for a response after sending each said message before sending a subsequent one of said messages;

each said information processor at a client location being programmed to check messages received by said location's receiver and transmitter, to validate messages received from said server and addressed to said location, to retrieve data from said memory and use the retrieved data to prepare responses to validated messages, and to operate said location's receiver and transmitter to send said responses to said server;

said information processor of said server being programmed to operate said server's receiver and transmitter to scan a range of radio frequencies to measure traffic and noise, to create a radio frequency hop map using information obtained from scanning, and to operate said server's receiver and transmitter to transmit said hop map to said client locations; and each said information processor at a client location being programmed to store said hop map and use it to determine frequencies of subsequent transmissions from said client location.

9. The system of claim 8, comprising a plurality of said servers each of which transmits polling messages to a different plurality of client locations, each said server having an information processor programmed to create and cause transmission of said hop maps.

10. The system of claim 8, wherein said information processor of said server is programmed to include, in each said polling message, an error correction field, and to check each said response for errors; and each said information processor at a client location is programmed to check messages received by said location's receiver and transmitter for errors.

* * * * *

UNITED STATES PATENT AND TRADEMARK OFFICE
CERTIFICATE OF CORRECTION

PATENT NO. : 5,541,589

DATED : July 30, 1996

INVENTOR(S) : Patrick J. Delaney

It is certified that error appears in the above-indentified patent and that said Letters Patent is hereby corrected as shown below:

In the Abstract [57], delete "and" in the 10th line, first occurrence.

Column 2, line 44, "client location's client location" should be -- client location's client identification --.

Column 10, line 34, "communicate on protocols" should be -- communication protocols --.

Column 11, line 9, there is a comma after "example".

Claim 3, column 12, 51st line from the top, there is a comma after "location".

Signed and Sealed this

Twelfth Day of November, 1996

Attest:

BRUCE LEHMAN

*Attesting Officer*  *Commissioner of Patents and Trademarks*